US009198310B2

(12) United States Patent
Eichelberg et al.

(10) Patent No.: US 9,198,310 B2
(45) Date of Patent: Nov. 24, 2015

(54) STALL CONTAINMENT OF RACK IN A DATA CENTER

(71) Applicant: Amazon Technologies, Inc., Reno, NV (US)

(72) Inventors: John William Eichelberg, Spokane, WA (US); Andrew Robert Schulz, Seattle, WA (US)

(73) Assignee: Amazon Technologies, Inc., Reno, NV (US)

(*) Notice: Subject to any disclaimer, the term of this patent is extended or adjusted under 35 U.S.C. 154(b) by 260 days.

(21) Appl. No.: 13/792,962

(22) Filed: Mar. 11, 2013

(65) Prior Publication Data
US 2014/0254089 A1 Sep. 11, 2014

(51) Int. Cl.
G06F 1/20 (2006.01)
H05K 5/02 (2006.01)
H05K 7/20 (2006.01)
(Continued)

(52) U.S. Cl.
CPC ............... *H05K 5/0213* (2013.01); *G06F 1/20* (2013.01); *H01L 23/36* (2013.01); *H05K 7/1488* (2013.01); *H05K 7/20* (2013.01); *H05K 7/20745* (2013.01); *H05K 13/00* (2013.01)

(58) Field of Classification Search
CPC ... H05K 7/20; H05K 7/20745; H05K 7/2079; H05K 7/1498; H05K 7/20827; H05K 7/20536; H05K 7/20145; H05K 5/02; H05K 5/0213; G06F 1/20
USPC .................. 361/679.46–679.5, 690–695, 715, 361/721–724; 165/80.2, 80.3, 104.33, 165/121–126, 185; 454/184; 312/223.2, 312/223.3, 236, 265
See application file for complete search history.

(56) References Cited

U.S. PATENT DOCUMENTS 4,702,535 A * 10/1987 Beun .............................. 312/308
5,443,312 A * 8/1995 Schluter ................... 312/334.27
(Continued)

FOREIGN PATENT DOCUMENTS

IE          85720 B3 *   3/2011
JP        2007285082     11/2007
(Continued)

OTHER PUBLICATIONS

International Search Report and Written Opinion in application No. 201201861-0 mailed May 28, 2013 pp. 1-12.
(Continued)

*Primary Examiner* — Michail V Datskovskiy
(74) *Attorney, Agent, or Firm* — Robert C. Kowert; Meyertons, Hood, Kivlin, Kowert & Goetzel, P.C.

(57) ABSTRACT

A system for managing air flow computing devices in a rack includes a stall and filler elements. The stall includes a stall top panel and two side panels spaced apart from one another. The stall accommodates a rack computing system. The filler elements fill gaps between the computing devices of the rack computing systems and the panels of the stalls. An air moving system moves air from the cold aisle through cold-aisle facing air inlets of the computing devices. The filler elements inhibit air moving toward the cold aisle-facing inlets from leaking through gaps between the computing devices of the rack computing systems and the stall panels such that the filler elements inhibit air moving toward inlets in the computing devices from leaking through the gaps between the computing devices in the rack and the stall panels.

21 Claims, 6 Drawing Sheets

(51) Int. Cl.
*H05K 13/00* (2006.01)
*H05K 7/14* (2006.01)
*H01L 23/36* (2006.01)

(56) References Cited

U.S. PATENT DOCUMENTS

| | | | |
|---|---|---|---|
| 5,943,219 | A | 8/1999 | Bellino et al. |
| 6,034,873 | A | 3/2000 | Ståhl et al. |
| 6,141,986 | A | 11/2000 | Koplin |
| 7,010,392 | B2 | 3/2006 | Bash et al. |
| 7,197,433 | B2 | 3/2007 | Patel et al. |
| 7,278,273 | B1 | 10/2007 | Whitted et al. |
| 7,511,959 | B2 | 3/2009 | Belady et al. |
| 7,688,578 | B2 * | 3/2010 | Mann et al. ............ 361/679.46 |
| 7,701,714 | B2 | 4/2010 | Shabany |
| 7,800,900 | B1 * | 9/2010 | Noteboom et al. ...... 361/679.47 |
| 7,841,199 | B2 | 11/2010 | Vangilder et al. |
| 7,916,470 | B2 * | 3/2011 | Mills et al. ............. 361/679.49 |
| 7,990,710 | B2 | 8/2011 | Hellriegel et al. |
| 8,054,625 | B2 * | 11/2011 | Noteboom et al. ........... 361/688 |
| 8,077,457 | B2 | 12/2011 | Gauthier et al. |
| 8,141,374 | B2 | 3/2012 | Hay |
| 8,151,578 | B1 | 4/2012 | Morales et al. |
| 8,514,572 | B2 * | 8/2013 | Rogers ........................ 361/695 |
| 8,628,158 | B2 * | 1/2014 | Caveney .................... 312/265.3 |
| 9,072,193 | B1 * | 6/2015 | Eichelberg ........................ 1/1 |
| 2005/0228618 | A1 | 10/2005 | Patel et al. |
| 2006/0065000 | A1 | 3/2006 | Belady |
| 2006/0082263 | A1 * | 4/2006 | Rimler et al. ................ 312/201 |
| 2007/0101746 | A1 | 5/2007 | Schlom et al. |
| 2007/0167125 | A1 | 7/2007 | Rasmussen et al. |
| 2007/0213000 | A1 | 9/2007 | Day |
| 2007/0274043 | A1 | 11/2007 | Shabany |
| 2008/0029250 | A1 | 2/2008 | Carlson et al. |
| 2008/0055846 | A1 | 3/2008 | Clidaras et al. |
| 2008/0055850 | A1 | 3/2008 | Carlson et al. |
| 2008/0094797 | A1 | 4/2008 | Coglitore et al. |
| 2008/0158818 | A1 | 7/2008 | Clidaras et al. |
| 2008/0259566 | A1 | 10/2008 | Fried |
| 2008/0270572 | A1 | 10/2008 | Belady et al. |
| 2009/0021907 | A1 * | 1/2009 | Mann et al. ...................... 361/686 |
| 2009/0046427 | A1 | 2/2009 | Noteboom et al. |
| 2009/0168345 | A1 | 7/2009 | Martini |
| 2009/0195977 | A1 | 8/2009 | Fink et al. |
| 2009/0207567 | A1 | 8/2009 | Campbell et al. |
| 2009/0210096 | A1 | 8/2009 | Stack et al. |
| 2009/0229194 | A1 * | 9/2009 | Armillas ........................ 52/79.1 |
| 2009/0301123 | A1 | 12/2009 | Monk et al. |
| 2010/0144265 | A1 | 6/2010 | Bednarcik et al. |
| 2010/0188810 | A1 | 7/2010 | Andersen et al. |
| 2011/0083824 | A1 | 4/2011 | Rogers |
| 2012/0012283 | A1 * | 1/2012 | Bean et al. ................ 165/104.33 |
| 2012/0244793 | A1 | 9/2012 | Lin et al. |
| 2012/0281352 | A1 * | 11/2012 | Namek et al. ............ 361/679.46 |
| 2013/0161273 | A1 * | 6/2013 | Borowsky et al. .............. 211/26 |
| 2013/0165035 | A1 * | 6/2013 | Krietzman et al. ............ 454/184 |
| 2013/0276389 | A1 * | 10/2013 | Marrs et al. .................. 52/173.1 |
| 2013/0300266 | A1 * | 11/2013 | Ramey et al. .................. 312/111 |

FOREIGN PATENT DOCUMENTS

| | | | | |
|---|---|---|---|---|
| JP | 02001022764 | A * | 2/2011 | ................ G06F 1/20 |
| WO | 2004083743 | | 9/2004 | |

OTHER PUBLICATIONS

Office Action from Japanese Patent Application No. 2012-532222, mailed Nov. 27, 2012 (English Translation and Japanese Versions), pp. 1.
International Search Report from PCT/US 10/50408 mailed Jan. 26, 2011, pp. 1-9.
Office Action from U.S. Appl. No. 12/568,323, mailed Jun. 20, 2013, Michael P. Czamara et al pp. 1-26.
Office Action from U.S. Appl. No. 12/568,323, mailed Jan. 9, 2013, Michael P. Czamara et al pp. 1-8.
U.S. Appl. No. 12/491,941, filed Jun. 25, 2009, Osvaldo P. Morales.
U.S. Appl. No. 12/341,137, filed Dec. 28, 2008, Jonathan David Hay.
U.S. Appl. No. 11/956,849, filed Dec. 14, 2007, Osvaldo P. Morales.
U.S. Appl. No. 12/163,146, filed Jun. 27, 2008, Osvaldo P. Morales.
U.S. Appl. No. 12/568,323, filed Sep. 28, 2009, Michael P. Czamara et al.
U.S. Appl. No. 13/525,057, filed Jun. 15, 2012, John W. Eichelberg et al.
U.S. Appl. No. 13/603,341, filed Sep. 4, 2012, Brock R. Gardner.
U.S. Appl. No. 13/603,348, filed Sep. 4, 2012, Brock R. Gardner.
U.S. Appl. No. 13/525,060, filed Jun. 15, 2012, John W. Eichelberg.
U.S. Appl. No. 13/525,057, filed Jun. 15, 2012, John W. Eichelberg.
U.S. Appl. No. 13/525,053, filed Jun. 15, 2012, John W. Eichelberg.
International Search Report and Written Opinion from PCT/US2014/022576, mailed Aug. 4, 2014, Amazon Technologies, Inc., pp. 1-12.

* cited by examiner

STALL CONTAINMENT OF RACK IN A DATA CENTER

BACKGROUND

Organizations such as on-line retailers, Internet service providers, search providers, financial institutions, universities, and other computing-intensive organizations often conduct computer operations from large scale computing facilities. Such computing facilities house and accommodate a large amount of server, network, and computer equipment to process, store, and exchange data as needed to carried out an organization's operations. Typically, a computer room of a computing facility includes many server racks. Each server rack, in turn, includes many servers and associated computer equipment.

Computer systems typically include a number of components that generate waste heat. Such components include printed circuit boards, mass storage devices, power supplies, and processors. For example, some computers with multiple processors may generate 250 watts of waste heat. Some known computer systems include a plurality of such larger, multiple-processor computers that are configured into rack-mounted components, and then are subsequently positioned within a rack system. Some known rack systems include 40 such rack-mounted components and such rack systems will therefore generate as much as 10 kilowatts of waste heat. Moreover, some known data centers include a plurality of such rack systems.

Some known data centers include methods and apparatus that facilitate waste heat removal from rack systems. In some data centers, server airflow leakage significantly reduced efficiency of cooling systems. According to some studies, for example, servers can leak cold air into the hot air stream at a rate of 23%-135% of their designed flow rate. Some containment systems will leak air and cause mixing due to height variations between racks at the top of containment systems and will leak air when exposed to differential static pressures over the area of the containment systems.

The amount of computing capacity needed for any given data center may change rapidly as business needs dictate. Most often, there is a need for increased computing capacity at a location. Initially providing computing capacity in a data center, or expanding the existing capacity of a data center (in the form of additional servers, for example), as well as cooling air for such additional capacity, is resource-intensive and may take many months to effect.

Figure 1:
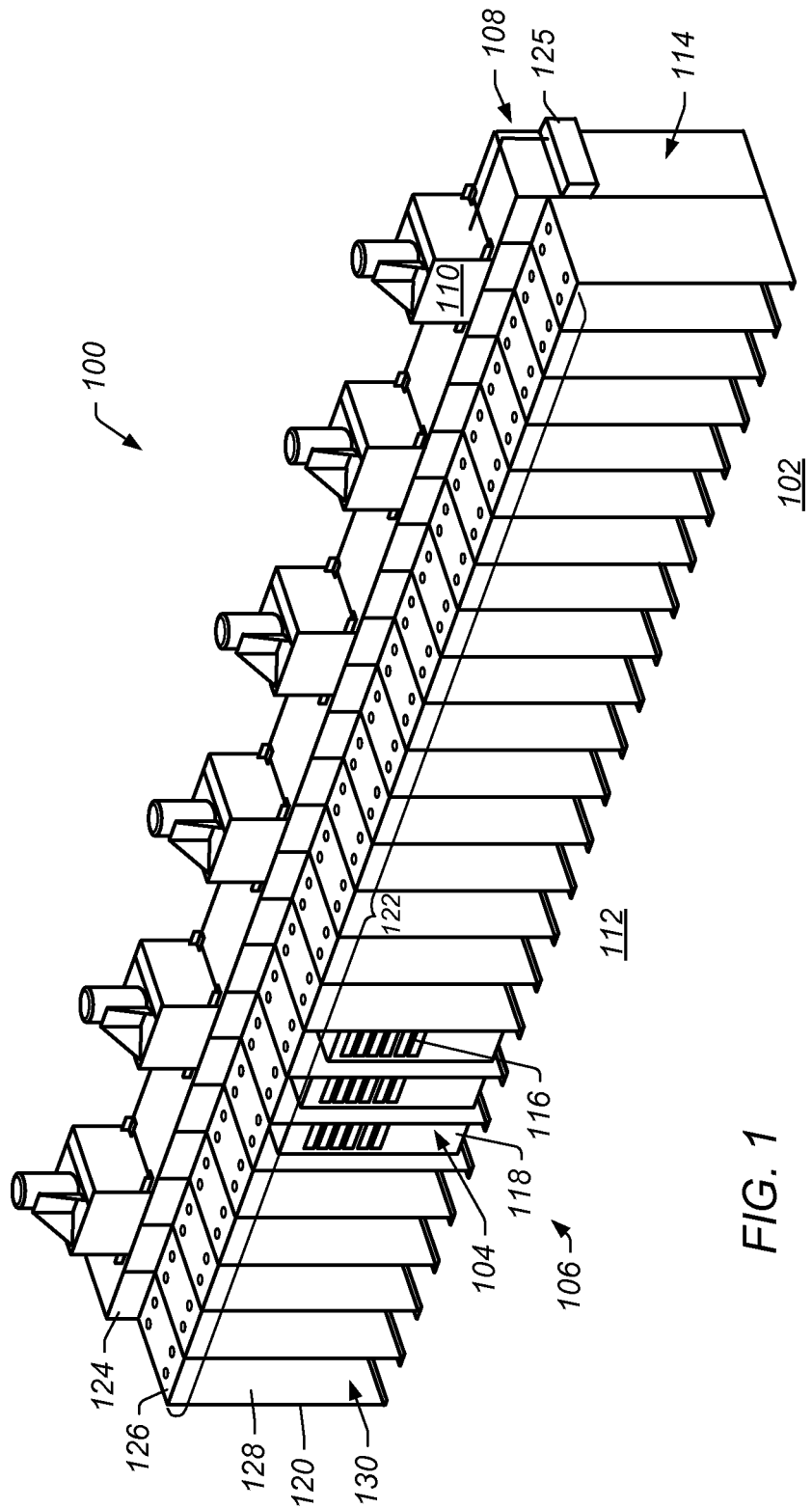
FIG. 1 illustrates one embodiment of a data center with a hot aisle containment system with stall containment of racks.

While the invention is susceptible to various modifications and alternative forms, specific embodiments thereof are shown by way of example in the drawings and will herein be described in detail. It should be understood, however, that the drawings and detailed description thereto are not intended to limit the invention to the particular form disclosed, but on the contrary, the intention is to cover all modifications, equivalents and alternatives falling within the spirit and scope of the present invention as defined by the appended claims. The headings used herein are for organizational purposes only and are not meant to be used to limit the scope of the description or the claims. As used throughout this application, the word "may" is used in a permissive sense (i.e., meaning having the potential to), rather than the mandatory sense (i.e., meaning must). Similarly, the words "include," "including," and "includes" mean including, but not limited to.

DETAILED DESCRIPTION OF EMBODIMENTS

Various embodiments of cooling systems, and systems and methods of managing flow of air to electrical systems are disclosed. According to one embodiment, a data center includes a computing room, one or more rack computing systems, and one or more stalls. The stalls include a stall top panel and two side panels spaced apart from one another. The stalls accommodate the rack computing systems. Filler elements fill gaps between the computing devices of the rack computing systems and the stall panels. An air moving system moves air from the cold aisle through cold-aisle facing air inlets of the computing devices. The filler elements inhibit air moving toward the cold aisle-facing inlets from leaking through gaps between the computing devices of the rack computing systems and the stall panels.

According to one embodiment, a system for managing air flow computing devices in a rack includes a stall and filler elements. The stall includes a stall top panel and two side panels spaced apart from one another. The stall accommodates a rack computing system. The filler elements fill gaps between the computing devices of the rack computing systems and the panels of the stalls. An air moving system moves air from the cold aisle through cold-aisle facing air inlets of the computing devices. The filler elements inhibit air moving toward the cold aisle-facing inlets from leaking through gaps between the computing devices of the rack computing systems and the stall panels such that the filler elements inhibit air moving toward inlets in the computing devices from leaking through the gaps between the computing devices in the rack and the stall panels.

According to one embodiment, a system for managing air for cooling rack-mounted computing devices includes hot aisle containment system and one or more stalls. The hot aisle containment system includes one or more frames and one or more hot aisle containment panels coupled to the frames. The stalls accommodate rack computing systems. The stalls couple with the hot aisle containment system at one or more openings in the hot aisle containment system.

According to one embodiment, a method of managing air for cooling computing devices a computing room including placing a rack computing system in a stall in a computing room. The stall has an opening to a cold aisle of the computing room. Gaps between computing devices in the rack computing system and in the stall are filled such that air is inhibited from leaking through the gaps.

As used herein, "air handling system" means a system that provides or moves air to, or removes air from, one or more systems or components.

As used herein, "ambient" refers to a condition of outside air at the location of a system or data center.

As used herein, an "aisle" means a space next to one or more racks.

As used herein, a "cable" includes any cable, conduit, or line that carries one or more conductors and that is flexible over at least a portion of its length. A cable may include a connector portion, such as a plug, at one or more of its ends.

As used herein, a "cold aisle" means an aisle from which air can be drawn for use in removing heat from a system, such as a rack computing system.

As used herein, "computing" includes any operations that can be performed by a computer, such as computation, data storage, data retrieval, or communications.

As used herein, "computing device" includes any of various devices in which computing operations can be carried out, such as computer systems or components thereof. One example of a computing device is a rack-mounted server. As used herein, the term computing device is not limited to just those integrated circuits referred to in the art as a computer, but broadly refers to a processor, a server, a microcontroller, a microcomputer, a programmable logic controller (PLC), an application specific integrated circuit, and other programmable circuits, and these terms are used interchangeably herein. Some examples of computing devices include e-commerce servers, network devices, telecommunications equipment, medical equipment, electrical power management and control devices, and professional audio equipment (digital, analog, or combinations thereof). In various embodiments, memory may include, but is not limited to, a computer-readable medium, such as a random access memory (RAM). Alternatively, a compact disc-read only memory (CD-ROM), a magneto-optical disk (MOD), and/or a digital versatile disc (DVD) may also be used. Also, additional input channels may include computer peripherals associated with an operator interface such as a mouse and a keyboard. Alternatively, other computer peripherals may also be used that may include, for example, a scanner. Furthermore, in the some embodiments, additional output channels may include an operator interface monitor and/or a printer.

As used herein, "data center" includes any facility or portion of a facility in which computer operations are carried out. A data center may include servers dedicated to specific functions or serving multiple functions. Examples of computer operations include information processing, communications, testing, simulations, power distribution and control, and operational control.

As used herein, "data center module" means a module that includes, or is suitable for housing and/or physically supporting, one or more computer systems that can provide computing resources for a data center.

As used herein, a "duct" includes any tube, pipe, conduit, or combination thereof, that has one or more passageways through which a fluid can be conveyed. Examples of materials for a duct include cloth, fabric, extruded metal, sheet metal, a polymer, or a combination thereof. A passageway of a duct may have any size and shape. The cross section of a duct may be square, round, ovate, rectangular, or irregular, A passageway of a duct may have a constant or changing cross section or a cross section that changes over the length of the passageway.

As used herein, a "hot aisle" means an aisle into which heated air can be discharged for use in removing heat from a system, such as a rack computing system.

As used herein, "infrastructure" means systems, components, or elements of a system that provide resources for a computing device, such as electrical power, data exchange capability with external systems, air, heat removal, and environmental control (for example, humidity control, particulate control).

As used herein, a "module" is a component or a combination of components physically coupled to one another. A module may include functional elements and systems, such as computer systems, racks, blowers, ducts, power distribution units, fire suppression systems, and control systems, as well as structural elements, such a frame, housing, or container. In some embodiments, a module is pre-fabricated at a location off-site from a data center.

As used herein, a "rack" means a rack, container, frame, or other element or combination of elements that can contain or physically support one or more computer systems.

As used herein, "rack computing system" means a system that includes one or more computing devices mounted in a rack.

As used herein, "room" means a room or a space of a building. As used herein, "computing room" means a room of a building in which computing devices, such as rack-mounted servers, can be operated.

As used herein, a "space" means a space, area or volume.

In one embodiment, each rack in a row of racks in a computing room is individually wrapped in its own isolated containment system. In some embodiments, a containment system is used accommodate racks set at a common maximum RMU (Rack Mount Unit) height (for example 42 RMU, 51 RMU, etc.)

In some embodiments, a containment system for computing devices in a rack includes a stall and one or more filler elements. The stall includes a top panel and two side panels. The filler elements fill the gaps between the panels of the stall and computing devices in the rack (for example, the front panels of the computing devices). The filler elements inhibit air moving toward cold-aisle facing panels of the computing devices from leaking through the gaps between the computing devices and the stall panels. In some embodiments, the filler elements are made of a resilient material (for example, neoprene).

In some embodiments, a data center includes stalls that accommodate rack computing systems. Filler elements fill gaps between panels of the stall and cold aisle-facing panels of computing devices in the rack (for example, the front panels of the computing devices). An air moving system (for example, a CRAC) moves air through the computing devices. The filler elements inhibit air from leaking through the gaps between the computing devices and the stall panels. All of the stalls in row of stalls may be of uniform dimensions (height, width, and depth). The size of the filler elements may vary from stall to stall to account for variations in the size of the rack being housed in each stall. For example, a relatively tall filler element would be used for a relatively short rack, since there would be a larger gap between the top panel of the stall and the top of the rack.

FIG. 1 illustrates one embodiment of a data center with a hot aisle containment system with stall containment of racks. Data center 100 includes computing room 102, rack computing systems 104 in rack row 106, hot aisle containment system 108, and air moving devices 110. In one embodiment, air moving devices 110 are exhaust fans. Computing room 102 includes cold aisle 112 and hot aisle 114 (in this example, hot aisle 114 is inside the walls of hot aisle containment system 108). Rack computing systems 104 include computing devices 116 and rack 118. Computing devices 116 are mounted in racks 118. Computing devices 116 include air inlets for receiving air from cold aisle 112.

Data center 100 includes stalls 120. Stalls 120 are arranged in stall row 122. Each of stalls 120 may abut containment wall 124 of hot aisle containment system 108. Each of stalls 120 includes top panel 126, side panels 128, and front opening 130. Front opening 130 faces cold aisle 112. Each of stalls 120 may accommodate one of rack computing systems 104. Stalls 120 may be of uniform dimensions with one another (height, width, and depth).

Each air moving device 110 may service a series of racks (for example, 3-4 racks). In some embodiments, each air moving device is controlled logic via a variable frequency drive.

Air moving devices 110 may be operated to create negative pressure in hot aisle 114 relative to the air at the inlet openings in rack computing systems 104 and computing devices 116. In the system shown in FIG. 1, the air pressure at the inlets may match the ambient air pressure in computing room 102. The negative pressure in hot aisle 114 may draw air through computing devices 116 installed in racks 118. Air moving devices 110 may pull heated air from the hot aisles and force the heated air through one or more ducts. Air passing through air moving devices 110 may be forced into a recirculation duct, to outside air, or a mixing plenum.

In some embodiments, a recirculation plenum receives some of the air discharged from air moving devices 110. A recirculation plenum may vent some air into computing room 102. Air from a recirculation plenum may be mixed with outside air introduced through intake vents. In some embodiments, air recirculated from an air removal system is combined with outside air in a mixing plenum.

Control system 125 may be coupled to air moving devices 110 (in FIG. 1, control system 125 is shown connected to only one of air moving devices 110 for clarity) by way of variable frequency drives (VFDs). Each VFD may receive control signals from control system 125 and subsequently modulate a rotational velocity of a fan in one of air moving devices 110. In certain embodiments, an outside air damper, return air damper, exhaust damper, or combinations thereof, are modulated via a control system to modulate air flow.

During operation of computing devices 116, air moving devices 110 may be operated to draw air from cold aisle 112 through computing devices 116 in rack computing systems 104. Heated air from computing devices 116 may be drawn into hot aisle containment system 108 and through air moving devices 110. Air moving devices may expel heated air from hot aisle to outside, to a mixing plenum, or both. Stalls 120 may inhibit leakage of air from cold aisle 112 around computing devices 116.

Figure 2A:
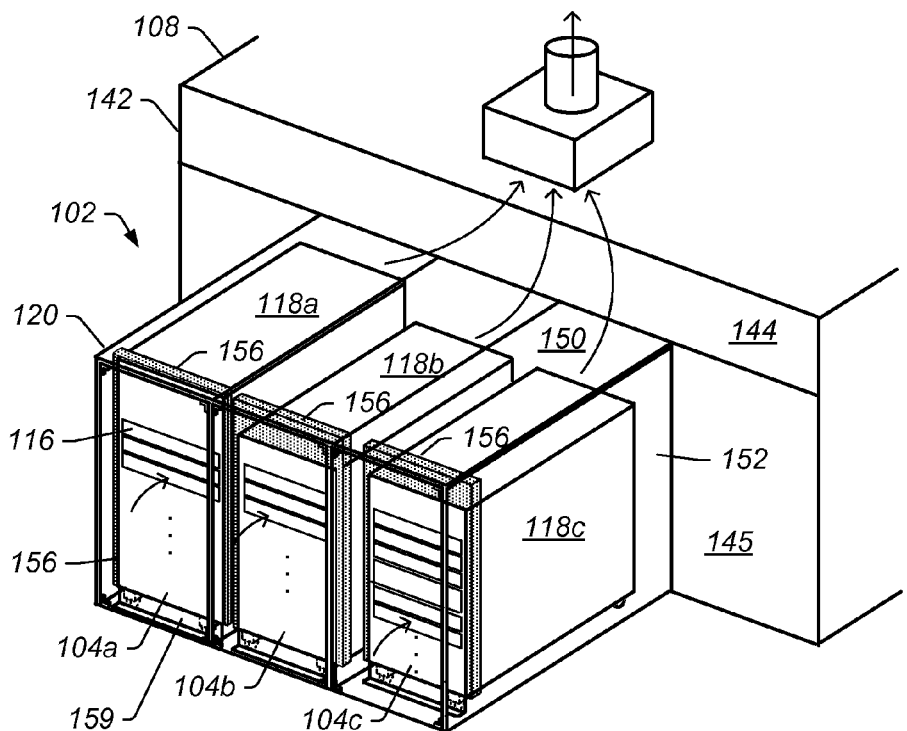
FIG. 2A illustrates one embodiment of stall containment of racks of varying sizes.
Figure 2B:
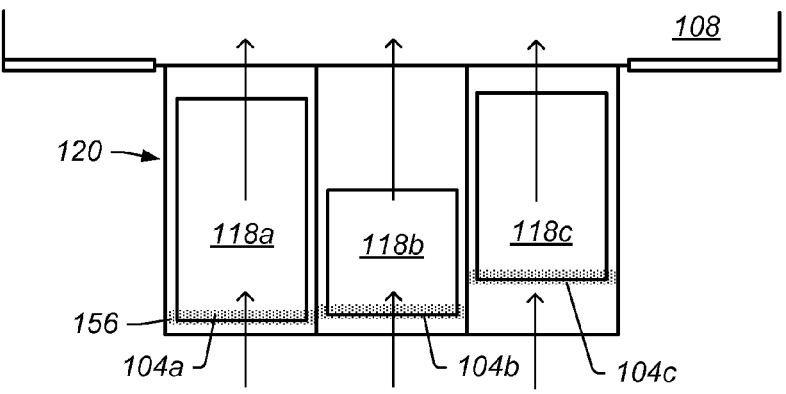
FIG. 2B is a top view illustrating stall containment of racks of varying sizes.
Figure 2C:
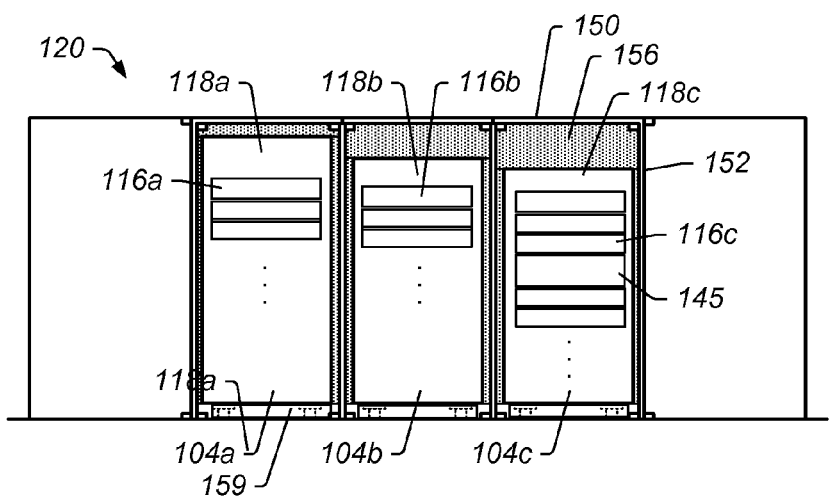
FIG. 2C is a front view illustrating stall containment of racks of varying sizes.

In some embodiments, stalls in a computing room accommodate rack computing systems of differing sizes. FIG. 2A illustrates one embodiment of stall containment of racks of varying sizes. FIG. 2B is a top view of the data center shown in FIG. 2A. FIG. 2C is a front view of the data center shown in FIG. 2A. Data center 140 includes rack computing systems 104a, 104b, and 104c, and stalls 120. Stalls 120 may be a uniform height, width, and depth. Stall 120 may back up against wall 142 of hot aisle containment system 108. Wall 142 includes upper panel 144 and openings for passage of air from rack computing systems 104a, 104b, and 104c. Hot aisle containment system 108 may be as described above relative to FIG. 1. Rack computing systems 104c includes blanking plate 145.

Rack computing systems 104a includes computing devices 116a and rack 118a. Rack computing systems 104b includes computing devices 116b and rack 118b. Rack computing systems 104c includes computing devices 116c and rack 118c. Each of racks 104a, 104b, and 104c may be a different size. For example, as illustrated in FIG. 2B, rack computing system 104c is not as long as rack computing systems 104a. As another example, as illustrated in FIG. 2C, rack computing systems 104b and 104c are shorter in height than rack computing system 104a.

Each of stalls 120 includes top panel 150 and side panels 152. Top panel 150 and side panels 152 may all be of the same length. Side panels 152 may be spaced apart from one another to define the width of the stall. In some embodiments, adjacent stalls 120 in the row share a common wall. For example, the stall accommodating rack computing system 104a may share a side panel with the stall accommodating rack computing system 104b, the stall accommodating rack computing system 104b may shall a side panel with the stall accommodating rack computing system 104c, and so on.

Filler elements 156 may be installed in the gaps formed between the panels of stalls 120 and computing devices 116 in the rack computing systems 104. Filler elements 156 may be made of a resilient material that expands to fill the gaps. Filler elements 156 may inhibit leakage of air around computing devices 116. Filler elements may be, in one embodiment, elastomeric strips that extend the length of a vertical or horizontal gap between the edges computing devices front panels and the panels of the stall. The size of filler elements may vary from stall to stall. In some embodiments, the size of the filler element varies to account for differences in the dimensions of the rack, or the computing devices in the racks.

Once a rack stall is erected, the rack stall may be mounted against a steel or aluminum frame box. The box may form the hot aisle. In one embodiment, a secondary box frame is installed on the back side of the first box to service a traditional hot/cold aisle configuration (for example, Cold-Rack-Hot|Hot-Rack-Cold). The stall containment may effectively "skin" the front side of the box, while the back side of the box is skinned with a solid panel, or left "un-skinned" to mate up adjacent hot aisle containment In some embodiments, the size of a gap may vary from one end of another of a gap due variations in rack dimensions, alignment, or both (for example, canting left to right in a stall). In addition, the size of a gap may vary from one stall to another. For example, due to variations in rack dimensions and floor slopes, the side gaps between computing devices 116 and side panels 128 may vary from width from rack-to-rack, and also over the height of the gap for a given rack. For example, the width of the gap may vary from a ¼ inch to ½ inch in width. In some embodiments, variations in the thickness of a gap or gaps are accounted for by expansion of resilient filler elements to fill different sized gaps. The width of filler element 156 in the side gaps may be selected to resiliently fill a gap over the range of expected widths.

In one embodiment, an individual containment stalls is made from 4 panels. For example, a stall may include a top "L" panel, two side panels, and a bottom "L" flange. The side panels and top panel may be reversible. In some embodiments, each some of the side panels in a row of stalls are common to two rack stalls, allowing for an incremental build to scale with rack demand. The fourth panel is an "L" shaped flange mounted at the base of the rack. The "L" shaped flange may cover the gap created by caster distance between the floor and bottom of the rack. For example, in the embodiment illustrated in FIGS. 2A-2C, stalls 120 include base air blocking device 159.

Figure 3:
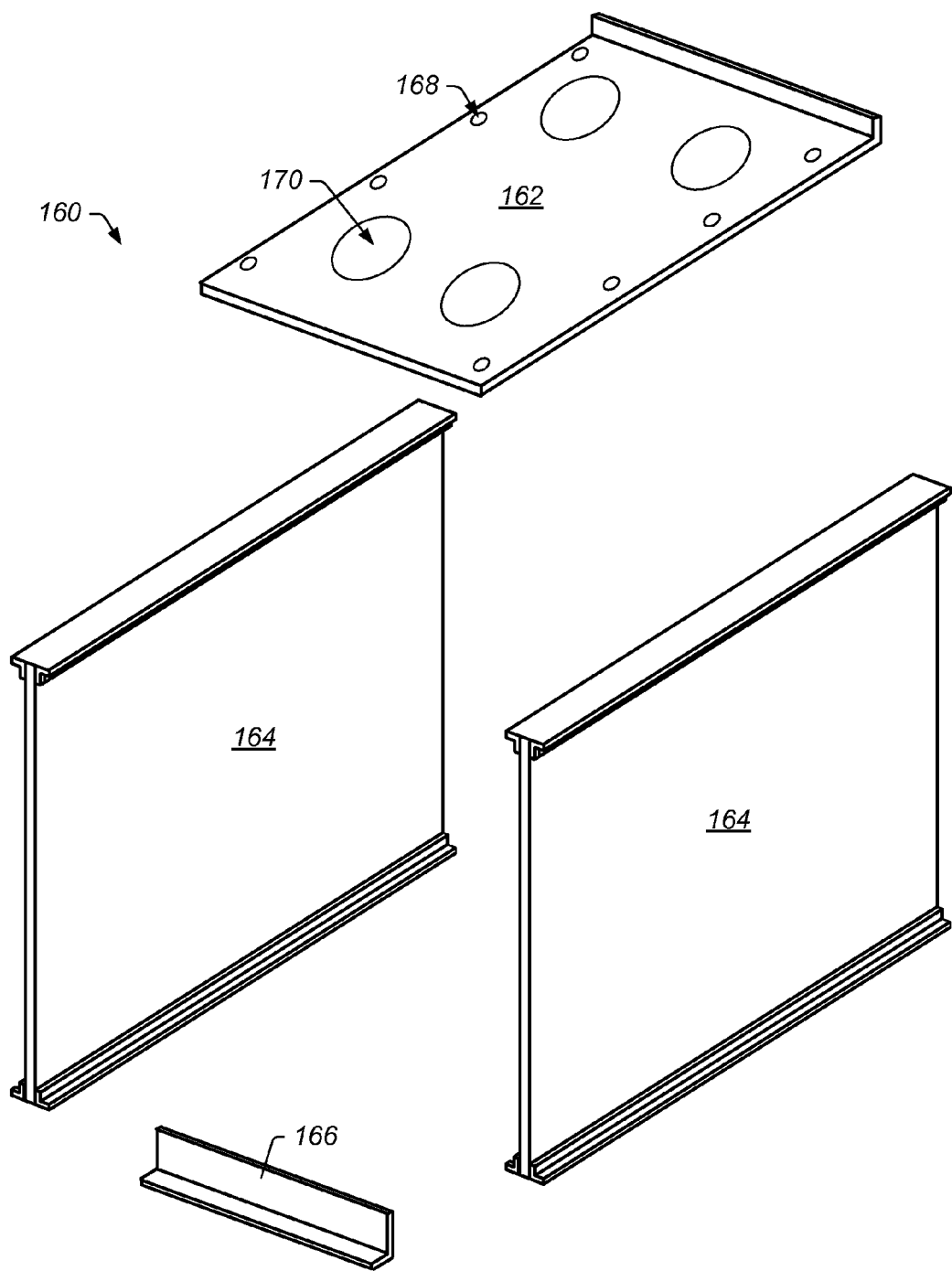
FIG. 3 is an exploded view illustrating one embodiment of a containment stall.

FIG. 3 is an exploded view illustrating one embodiment of a containment stall. Containment stall 160 includes top panel 162, side panels 164, and base air blocking device 166. Fasteners 168 may be used to secure top panel 162 to side panels 164. In one embodiment, fasteners 168 are ¼ cam fasteners.

Examples of other fasteners that may be used in various embodiments include screws, clips, and hook and loop strips. In one embodiment, stall panels are aluminum sheets. Each side panel may have holes punched at an interval along its edge. The holes may be used to secure filler elements as described above relative to FIGS. 2A-2C. In some embodiments, base air blocking device 166 is attached to the floor of the stall after a rack has been rolled into the stall.

Top panel includes cut outs 170. Cut outs 170 may include plastic grommets to allow for whips and communication cable routing from the inside of each stall up through the top "L" plate. Grommets may create seal and minimize air leakage. Placement of the 4" cut outs will be on all four corners of the top "L" plate. In some embodiments, a top panel includes brackets for mounting equipment in a cold aisle, such as an automatic transfer switch. In certain embodiments, a tier basket tray is mounted by way of all-thread poles. The basket tray may be used for infrastructure elements (for example, communication cabling and whips from circuit breaker panels) serving racks in the stall.

In some embodiments, individual rack louver dampeners are included on a stall to control airflow. The dampeners may be automated and utilize logic to open and close louvers based on rack demand. In certain embodiments, the system may control a thermo expansion actuator that is measuring server exhaust temperature. The louvers may be modulated (for example, opened/closed) based on server exhaust heat fluctuation. Louvers may be built to match per server form factor or a sub-rack increment (for example, ⅛ rack, ¼ rack, ⅓ rack, ½ rack), to meet the need of per rack/server airflow requirements based on utilization.

Figure 4A:
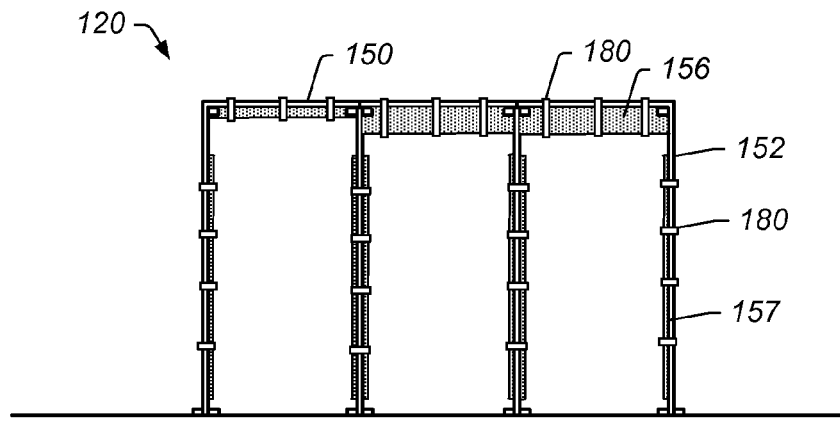
FIGS. 4A-4C illustrates one embodiment of installation of a rack in a stall.
Figure 4B:
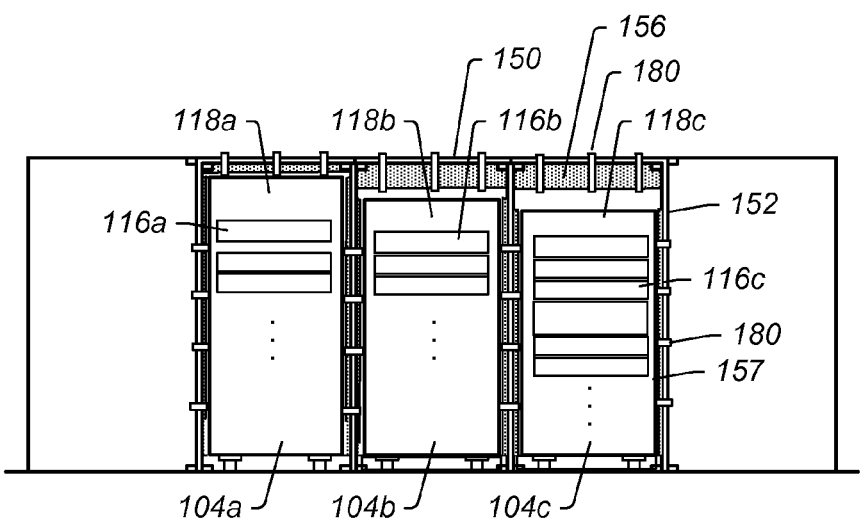
Figure 4C:
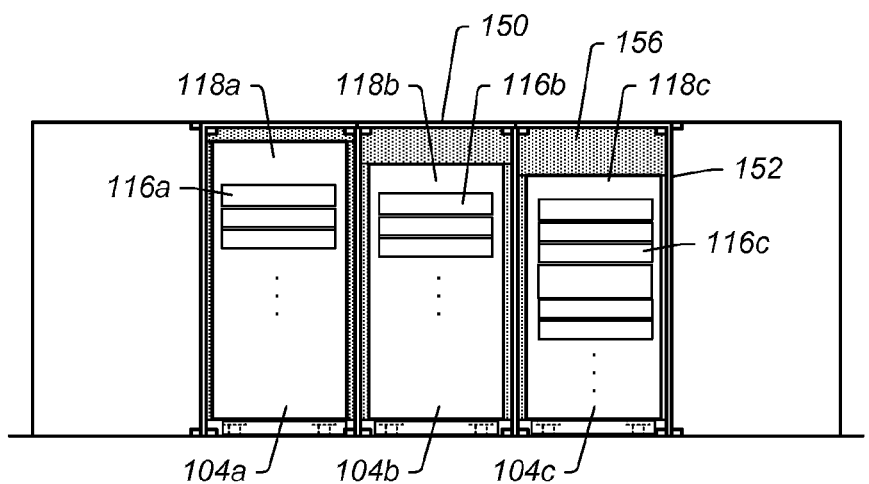

In some embodiments, filler elements for a stall containment system are attached to a stall before the rack is positioned in the stall. FIGS. 4A-4C illustrates one embodiment of installation of a rack in a stall. In FIG. 4A, top filler element 156 and side filler elements 157 are attached on the sides of stall 120. Top filler elements 156 and side filler elements 157 may be attached by way of ties 180. Ties 180 may serve as retaining elements for top filler element 156 and side filler element 157 to keep the filler elements in a compressed state during installation of the rack computing system in the stall. Ties 180 may hold top filler elements 156 and side filler elements 157 in a partially compressed state against the sides of rack 118.

In FIG. 4B, rack computing systems 104a, 104b, and 104c may each be placed in one of stalls 120. Ties 180 may maintain top filler elements 156 and side filler elements 157 in a compressed state when rack computing systems 104a, 104b, and 104c are moved into stalls 120, such that each rack computing system clears filler elements 156 and 157.

Once rack computing systems 104a, 104b, and 104c are in position in stalls 120, ties 180 may be cut or unfastened. Once ties 180 have been operated to related top filler elements 156 and side filler elements 157, the filler elements may expand to fill the gaps between stall panels 150 and 152 and computing devices 116.

Figure 5:
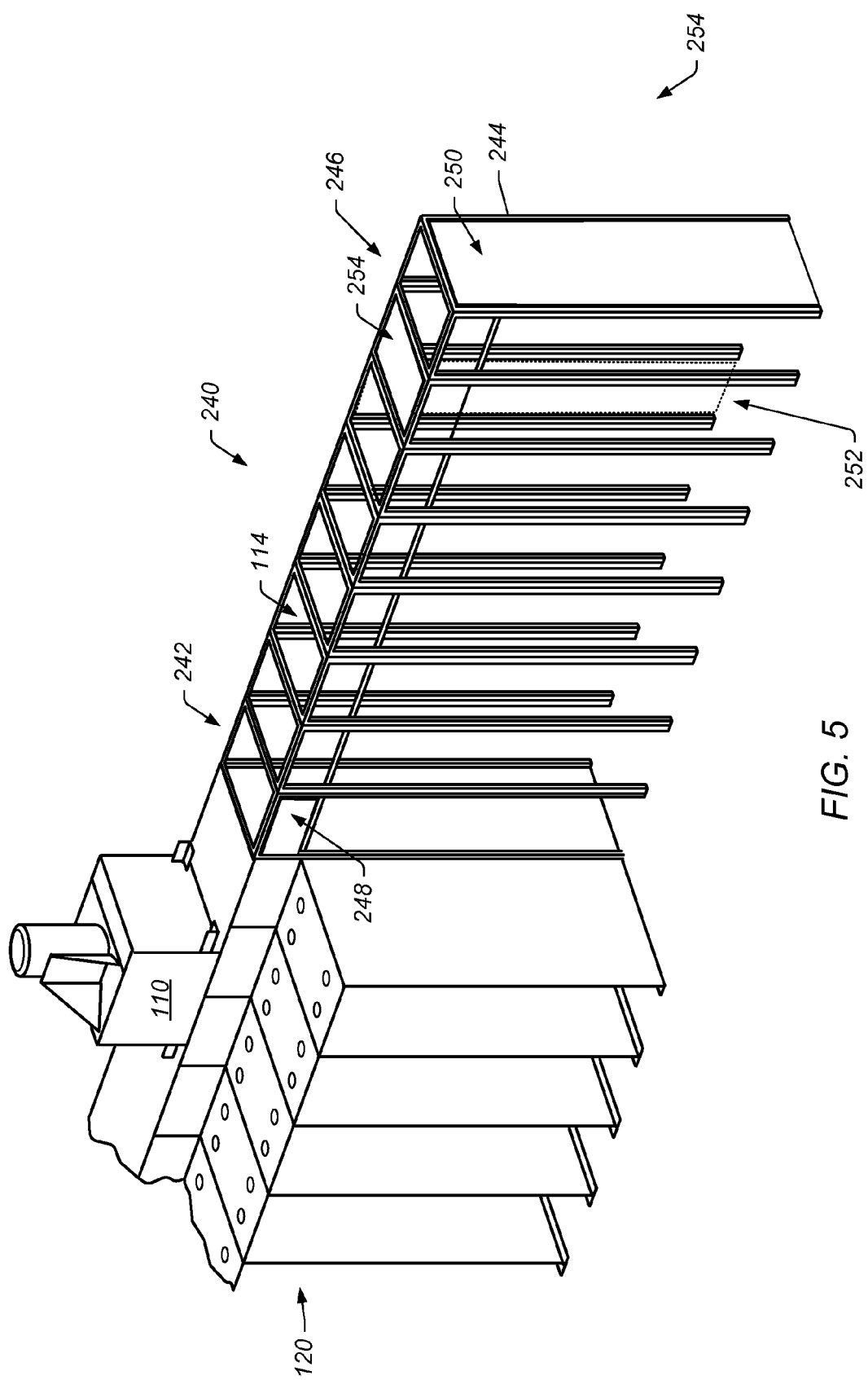
FIG. 5 illustrates one embodiment of a data center with a hot aisle containment system built from modular frames.

In some embodiments, a hot aisle containment system is made using modular frames. Each of the modular frames may allow connection of two or more stalls for rack computing systems. As additional cooling capacity is needed, additional modular frame sections may be added to accommodate additional stalls. FIG. 5 illustrates one embodiment of a data center with a hot aisle containment system built from modular frames. Data center 240 includes hot aisle containment system 242 and stalls 120. Hot aisle containment system 242 includes box frames 244 and panels 246. In this example, panels 246 include upper panels 248, end panels 250, and rear panels 252, and top panels 254. Panels 246 may be attached to one of box frames 244 to create an enclosed space for hot aisle 114. In some embodiments, each box frame is built ridged to support localized exhaust fans.

As additional capacity is needed in data center 242, additional box frames 244 may be constructed. Each additional box frame 244 may be used to create a new hot aisle, or to enlarge an existing hot aisle. In one embodiment, for example, one of box frames 244 is attached at the end of a row of existing box frames 244 to lengthen a hot aisle. The new box frame 244 may include openings for attaching one or more additional stalls 120 to a row of stalls. In the embodiment shown in FIG. 5, frame 244 is shown for illustrative purposes as accommodating up to 8 stalls/rack computing systems. In various embodiments, however, a box frame module may accommodate any number of stalls. For example, a box frame may accommodate 1, 4, 6, or 10 stalls. Each of the new stalls may accommodate additional rack-mounted computing systems.

Figure 6:
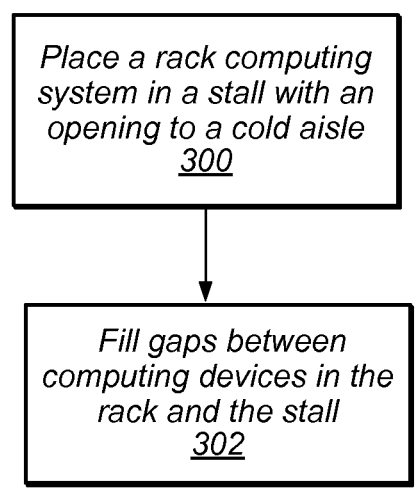
FIG. 6 illustrates inhibiting leakage of air being supplied for computing devices a computing room.

In some embodiments, inhibiting leakage of air for cooling computing devices a computing room includes placing the rack computing system in a stall and filling the gaps between computing devices in the rack and the stall to inhibit air from a cold aisle from leaking around the computing devices in the rack. FIG. 6 illustrates inhibiting leakage of air being supplied for computing devices a computing room. At 300, a rack computing system is placed in a stall having an opening to a cold aisle of the computing room. In some embodiments, stall in constructed from a top panel and a pair of spaced-apart side panels.

At 302, gaps are filled between computing devices in the rack computing system and stall such that air is inhibited from leaking through the gaps. In some embodiments, the gaps are filled by releasing filler elements to fill gaps after rack is put in stall. The filler elements may resiliently expand to fill the size of the gaps. In some embodiments, resilient filler elements are secured to the stall panels or the rack computing system with a temporary securing device, such as a cable tie. Once the rack has been rolled into position, the temporary securing device can be removed to release resilient filler element such that the resilient filler element fills the gap.

Blanking plates placed in any empty slots in the rack. Filler elements, a rigid air blocking device, or both, may be placed in the gap between the bottom edge of the rack computing system and the floor.

Although the embodiments above have been described in considerable detail, numerous variations and modifications will become apparent to those skilled in the art once the above disclosure is fully appreciated. It is intended that the following claims be interpreted to embrace all such variations and modifications.

What is claimed is:

1. A data center comprising:
a computing room comprising:
  a cold aisle; and
  a hot aisle containment system comprising:
    one or more frames; and
    one or more hot aisle containment panels coupled to at least one of the frames;
a plurality of rack computing systems, wherein at least one of the rack computing systems comprises:
  a rack; and
  a plurality of computing devices coupled to the rack, wherein at least one of the computing devices comprises a cold-aisle facing panel, wherein the cold-aisle facing panel comprises one or more cold aisle-facing air inlets;

one or more stalls, wherein at least one of the stalls comprises a stall top panel configured to couple with at least one of the hot aisle containment panels and two stall side panels spaced apart from one another, wherein at least one of the stalls is configured to accommodate at least one of the rack computing systems, and wherein the at least one of the hot aisle containment panels extends above the stall top panel to at least partially enclose the hot aisle containment system;

one or more filler elements configured to fill gaps between the computing devices of at least one of the rack computing systems and at least one of the stall panels; and an air moving system configured to move air from the cold aisle through the cold-aisle facing air inlets of one of the computing devices in a plurality of the rack computing systems and into the hot aisle containment system, wherein the filler elements are configured to at least partially inhibit air moving toward the cold aisle-facing inlets from leaking through gaps between the computing devices of the at least one rack computing system and the at least one stall panel.

2. The data center of claim 1, wherein the one or more stalls comprise two or more stalls, wherein the one or more rack computing systems comprise two or more rack computing systems, wherein each of at least two of the stalls is configured to accommodate a different one of the rack computing systems.

3. The data center of claim 2, wherein the rack computing system in at least a first one of the stalls is a different height than a rack computing system in at least a second one of the stalls, wherein at least one filler element in each of the first one of the stalls and the second one of the stalls fills a gap between the rack computing system and the top panel of the stall.

4. The data center of claim 2, wherein the rack computing system in at least a first one of the stalls is a different depth than a rack computing system in at least a second one of the stalls, wherein at least one filler element in each of the first one of the stalls and the second one of the stalls fills a gap between the rack computing system and the top panel of the stall.

5. The data center of claim 1, wherein the one or more stalls comprise two or more stalls, wherein at least two of the stalls share a common side panel with one another.

6. A system for managing air flow from computing devices in a rack, comprising:

a stall comprising a stall top panel and two stall side panels, wherein the two stall side panels are configured to couple with the stall top panel such that the stall accommodates a rack computing system, and wherein the stall top panel is configured to couple with a hot aisle containment panel of a hot aisle containment system, wherein the hot aisle containment system comprises an air moving system configured to draw air through a plurality of rack computing systems into the hot aisle containment system, and wherein the hot aisle containment panel extends above the stall top panel to at least partially enclose the hot aisle containment system; and one or more filler elements, wherein at least one of the filler elements is configured to fill one or more gaps between computing devices in the rack computing system and at least one of the stall panels such that the filler elements at least partially inhibit air moving toward inlets in the computing devices from leaking through at least one of the gaps between the computing devices in the rack and the at least one stall panel.

7. The system of claim 6, wherein at least one of the filler elements comprises a resilient material.

8. The system of claim 6, wherein at least one of the filler elements comprises a resilient material, wherein the filler element is configured to expand to fill at least one of the one or more gaps between the computing devices and the stall panels.

9. The system of claim 6, further comprising at least one blanking plate configured to couple with the rack computing system, wherein the blanking plate is configured to fill at least one gap in the rack computing system.

10. The system of claim 6, wherein the one or more filler elements are configured to fill one or more gaps between computing devices in the rack computing system and the top panel of the stall.

11. The system of claim 6, wherein the one or more filler elements are configured to fill one or more gaps between computing devices in the rack computing system and at least one of the side panels of the stall.

12. The system of claim 11, wherein at least one of the filler elements is configured to fill one or more gaps of varying width between the computing devices and at least one of the side panels.

13. The system of claim 6, further comprising a bottom air blocking device configured to inhibit air from leaking under computing devices in the rack computing system.

14. The system of claim 6, wherein the hot aisle containment panel inhibits air from moving between the cold aisle and the hot aisle containment system above the top panel of the stall.

15. A system for managing air for cooling rack-mounted computing devices, comprising:

a hot aisle containment system comprising:
one or more frames; and
one or more hot aisle containment panels coupled to the at least one of the frames; and one or more stalls configured to accommodate at least one rack computing system, wherein the stalls are configured to couple with the hot aisle containment system at one or more openings in the hot aisle containment system, and wherein the one or more stalls comprise a stall top panel configured to couple with one of the one or more hot aisle containment panels, and wherein the one or more hot aisle containment panels extend above the stall top panel to at least partially enclose the hot aisle containment system; and an air moving system configured to draw air through a plurality of rack computing systems into the hot aisle containment system.

16. The system of claim 15, further comprising one or more filler elements configured to fill one or more gaps between computing devices in the at least one rack computing system and at least one of the stalls such that the filler elements at least partially inhibit air moving toward the inlets in the computing devices from leaking through at least one of the gaps between the computing devices in the rack and the at least one stall.

17. The system of claim 15, wherein the one or more frames comprise two or more frames, wherein each of at least one of the frames is configured to couple with two or more of the stalls.

18. A method of managing air for cooling computing devices in a computing room, comprising:

coupling a stall to a hot aisle containment system, wherein coupling the stall to the hot aisle containment system comprises coupling a top panel of the stall to a hot aisle containment panel that extends above the top panel to inhibit air from moving between a cold aisle of the computing room and the hot aisle containment system, wherein the hot aisle containment system comprises an air moving device configured to draw air into the hot aisle containment system from a plurality of stalls;

placing a rack computing system in the stall, wherein the stall has an opening to the cold aisle of the computing room; and filling gaps between computing devices in the rack computing system and in the stall such that air is inhibited from leaking through the gaps.

19. The method of claim 18, wherein filling gaps between the computing devices and the stall comprises:

attaching one or more filler elements to the stall before the rack computing system is placed in the stall; and allowing at least one of the filler elements to resiliently expand to fill at least one of the gaps.

20. The method of claim 19, wherein at least one of the filler elements is a resilient filler element, wherein attaching at least one of the filler elements to the stall comprises securing the at least one resilient filler element to the stall with a temporary securing device, and releasing the temporary securing device from the at least one resilient filler element to allow the at least one resilient filler element to at least partially expand in the gap.

21. The method of claim 18, further comprising installing at least one blanking plate in the rack computing system.

* * * * *